US012566464B2

(12) United States Patent
Huang et al.

(10) Patent No.: US 12,566,464 B2
(45) Date of Patent: Mar. 3, 2026

(54) POWER GROUND NOISE REDUCTION SYSTEM CAPABLE OF REDUCING NOISE VOLTAGE INTERFERENCE

(71) Applicant: Himax Imaging Limited, Tainan City (TW)

(72) Inventors: Puo-Tsang Huang, Tainan City (TW); Zheng-Zhi Huang, Tainan City (TW); Ya-Sen Chang, Tainan City (TW); Chen-Cheng-Hung Hung, Tainan City (TW); Ghia-Ming Hong, Tainan City (TW)

(73) Assignee: Himax Imaging Limited, Tainan City (TW)

( * ) Notice: Subject to any disclaimer, the term of this patent is extended or adjusted under 35 U.S.C. 154(b) by 385 days.

(21) Appl. No.: 18/236,388

(22) Filed: Aug. 21, 2023

(65) Prior Publication Data

US 2025/0068197 A1 Feb. 27, 2025

(51) Int. Cl.
| | |
|---|---|
| *G05F 1/46* | (2006.01) |
| *G05F 1/565* | (2006.01) |
| *G05F 3/26* | (2006.01) |
| *H03K 3/011* | (2006.01) |
| *G05F 1/56* | (2006.01) |

(52) U.S. Cl.
CPC .............. *G05F 1/468* (2013.01); *G05F 1/565* (2013.01); *G05F 3/262* (2013.01); *H03K 3/011* (2013.01); *G05F 1/56* (2013.01)

(58) Field of Classification Search
CPC ... G05F 1/10; G05F 1/46; G05F 1/461; G05F 1/462; G05F 1/467; G05F 1/468; G05F 1/56; G05F 1/565; G05F 1/575; G05F 3/16; G05F 3/24; G05F 3/26; G05F 3/262; G05F 3/30; H03K 3/011
See application file for complete search history.

(56) References Cited

U.S. PATENT DOCUMENTS

| | | | | |
|---|---|---|---|---|
| 6,377,113 B1 * | 4/2002 | Kanno | .................... | G05F 3/242 |
| | | | | 327/543 |
| 2012/0098506 A1 * | 4/2012 | Hu | .......................... | G05F 3/262 |
| | | | | 323/265 |

(Continued)

FOREIGN PATENT DOCUMENTS

| | | |
|---|---|---|
| CN | 115379143 A | 11/2022 |
| TW | 200926789 | 6/2009 |

(Continued)

*Primary Examiner* — Thienvu V Tran
*Assistant Examiner* — Shahzeb K Ahmad
(74) *Attorney, Agent, or Firm* — Winston Hsu

(57) ABSTRACT

A power ground noise reduction system includes a bandgap circuit and a noise reduction circuit. The bandgap circuit includes an input terminal for receiving a working voltage, and an output terminal for outputting a bandgap reference voltage. The noise reduction circuit includes a first input terminal coupled to the output terminal of the bandgap circuit for receiving the bandgap reference voltage, a second input terminal for receiving the working voltage, a ground terminal coupled to a low voltage terminal, a first current source for receiving the working voltage received by the second input terminal and generating a first current, and a second current source for generating a second current to the low voltage terminal through the ground terminal.

19 Claims, 6 Drawing Sheets

(56)                    References Cited

U.S. PATENT DOCUMENTS

| | | | | |
|---|---|---|---|---|
| 2015/0035591 | A1* | 2/2015 | Nicollini .................. | G05F 1/56 |
| | | | | 327/543 |
| 2016/0173066 | A1* | 6/2016 | Yang ............... | H03K 19/01714 |
| | | | | 327/109 |
| 2017/0160145 | A1* | 6/2017 | Chiang .................. | G05F 1/468 |
| 2020/0387186 | A1* | 12/2020 | Chen ...................... | G05F 1/468 |
| 2022/0397925 | A1* | 12/2022 | Tiruvamattur .......... | G05F 3/262 |
| 2024/0154512 | A1* | 5/2024 | Yeh ...................... | H02M 3/155 |
| 2025/0123642 | A1* | 4/2025 | Hunter .................. | G05F 1/595 |

FOREIGN PATENT DOCUMENTS

| | | | |
|---|---|---|---|
| TW | 201413415 A | 4/2014 | |
| TW | 201418931 A | 5/2014 | |

* cited by examiner

POWER GROUND NOISE REDUCTION SYSTEM CAPABLE OF REDUCING NOISE VOLTAGE INTERFERENCE

BACKGROUND OF THE INVENTION

1. Field of the Invention

The present invention illustrates a power ground noise reduction system, and more particularly, a power ground noise reduction system capable of reducing noise voltage interference.

2. Description of the Prior Art

With the rapid development of science and technology, various image sensor circuits have been adopted in our daily life. Particularly, a ramp generator in a single slope analog to digital converter can be applied to the image sensor circuits. Further, power noise and ground noise may be introduced to the ramp generator since voltage fluctuations of a power source terminal and a ground terminal of the ramp generator are unavoidable. Since the outputted single-ended ramp waveform is sensitive to the introduced power noise and the ground noise, the single-ended ramp waveform output may be distorted.

Therefore, to develop a power ground noise reduction system for reducing noise voltage interference of the ramp generator is an important design issue.

SUMMARY OF THE INVENTION

In an embodiment of the present invention, a power ground noise reduction system is disclosed. The power ground noise reduction system comprises a bandgap circuit and a noise reduction circuit. The bandgap circuit comprises an input terminal configured to receive a working voltage, and an output terminal configured to output a bandgap reference voltage. The noise reduction circuit comprises a first input terminal coupled to the output terminal of the bandgap circuit and configured to receive the bandgap reference voltage, a second input terminal configured to receive the working voltage, a ground terminal coupled to a low voltage terminal, a first current source configured to receive the working voltage received by the second input terminal and generate a first current, and a second current source configured to generate a second current to the low voltage terminal through the ground terminal.

In another embodiment of the present invention, a power ground noise reduction system is disclosed. The power ground noise reduction system includes a ramp signal generator. The ramp signal generator comprises a current mirror circuit, a bit current source circuit, a current switch circuit, a counter logic circuit, a second resistor string, and a third current source. The current mirror circuit is configured to receive a first buffered working voltage. The bit current source circuit is coupled to the current mirror circuit. The current switch circuit is coupled to the bit current source circuit and configured to output a first ramp signal. The counter logic circuit is coupled to the current switch circuit and configured to control the current switch circuit. The second resistor string comprises a first terminal coupled to the current switch circuit, and a second terminal. The third current source is coupled to the second terminal of the second resistor string and configured to generate a third current to a low voltage terminal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
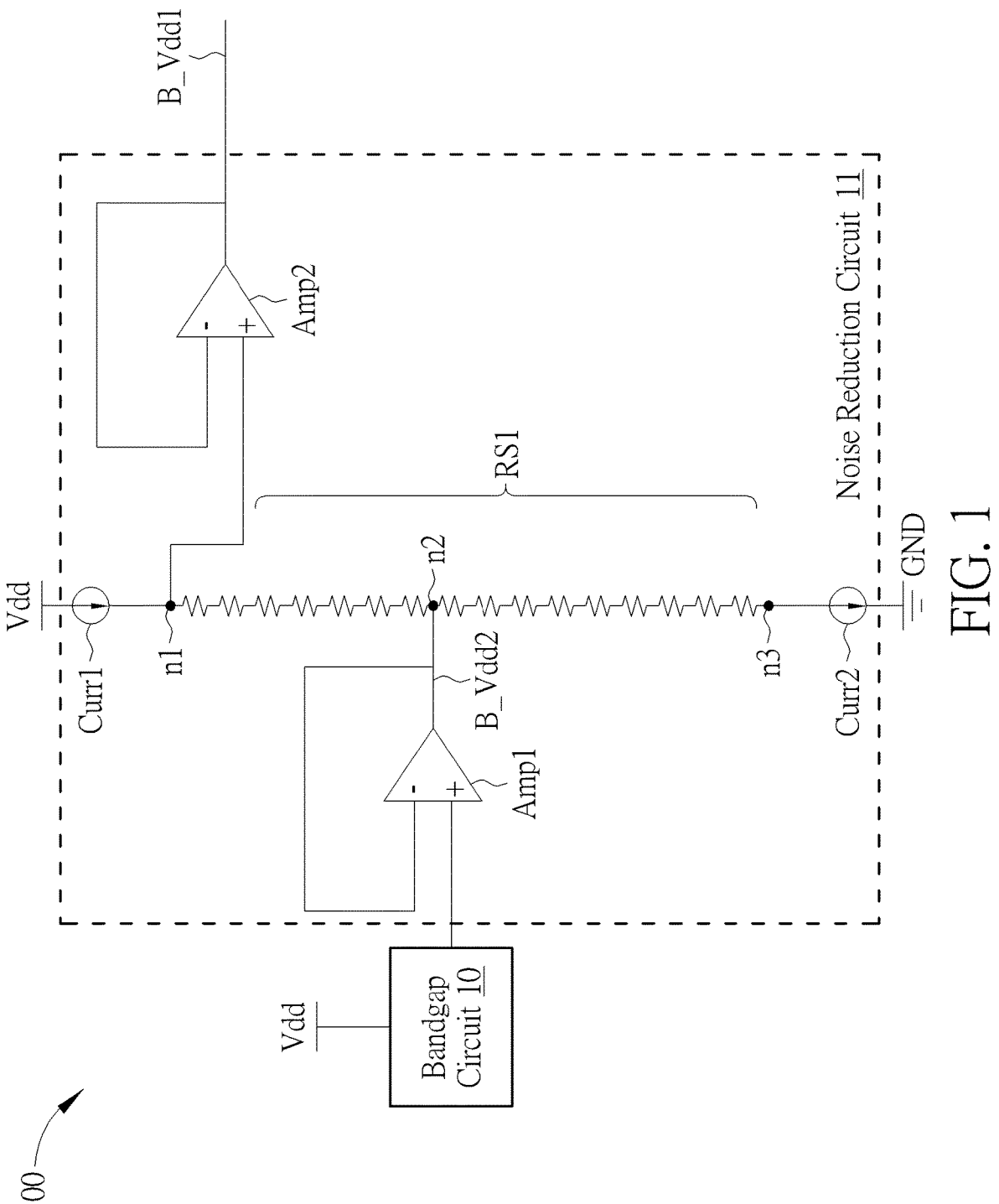
FIG. 1 is a block diagram of a power ground noise reduction system according to an embodiment of the present invention.

FIG. 1 is a block diagram of a power ground noise reduction system 100 according to an embodiment of the present invention. The power ground noise reduction system can include a bandgap circuit 10 and a noise reduction circuit 11. The bandgap circuit 10 can be regarded as a reference voltage source having high stability. The bandgap circuit 10 includes an input terminal for receiving a working voltage Vdd, and an output terminal for outputting a bandgap reference voltage. The noise reduction circuit 11 includes a first input terminal, a second input terminal, an output terminal, a ground terminal, a first current source, and a second current source. The first input terminal is coupled to the output terminal of the bandgap circuit 10 for receiving the bandgap reference voltage. The second input terminal is used for receiving the working voltage. The output terminal is used for outputting a first buffered working voltage B_Vdd1. The ground terminal is coupled to a low voltage terminal GND. The first current source Curr1 is used for receiving the working voltage Vdd received by the second input terminal and generating a first current. The second current source Curr2 is used for generating a second current to the low voltage terminal GND through the ground terminal. Here, in the power ground noise reduction system 100, since the first current source Curr1 is introduced for steadily providing the first current, the power noise of the input terminal corresponding to the working voltage Vdd can be reduced. Since the second current source Curr2 is introduced for steadily providing the second current, the ground noise of the low voltage terminal GND can be reduced. In the power ground noise reduction system 100, the first current of the first current source Curr1 is greater than the second current of the second current source Curr2.

In FIG. 1, the noise reduction circuit further includes a first amplifier Amp1, a first resistor string RS1, and a second amplifier Amp2. The first amplifier Amp1 includes a first input terminal, a second input terminal for receiving the bandgap reference voltage, and an output terminal coupled to the first input terminal of the first amplifier Amp1 for outputting a second buffered working voltage B_Vdd2. The first resistor string RS1 includes a first node n1 coupled to the first current source Curr1, a second node n2 coupled to the output terminal of the first amplifier Amp1, and a third node n3 coupled to the second current source Curr2. The second amplifier Amp2 includes a first input terminal, a second input terminal coupled to the first node n1 of the first resistor string RS1, and an output terminal coupled to the first input terminal of the second amplifier Amp2 for outputting the first buffered working voltage B_Vdd1. Further, in the power ground noise reduction system 100, the first current source Curr1 and the second current source Curr2 can be implemented by various circuit structures, as illustrated below.

Figure 2:
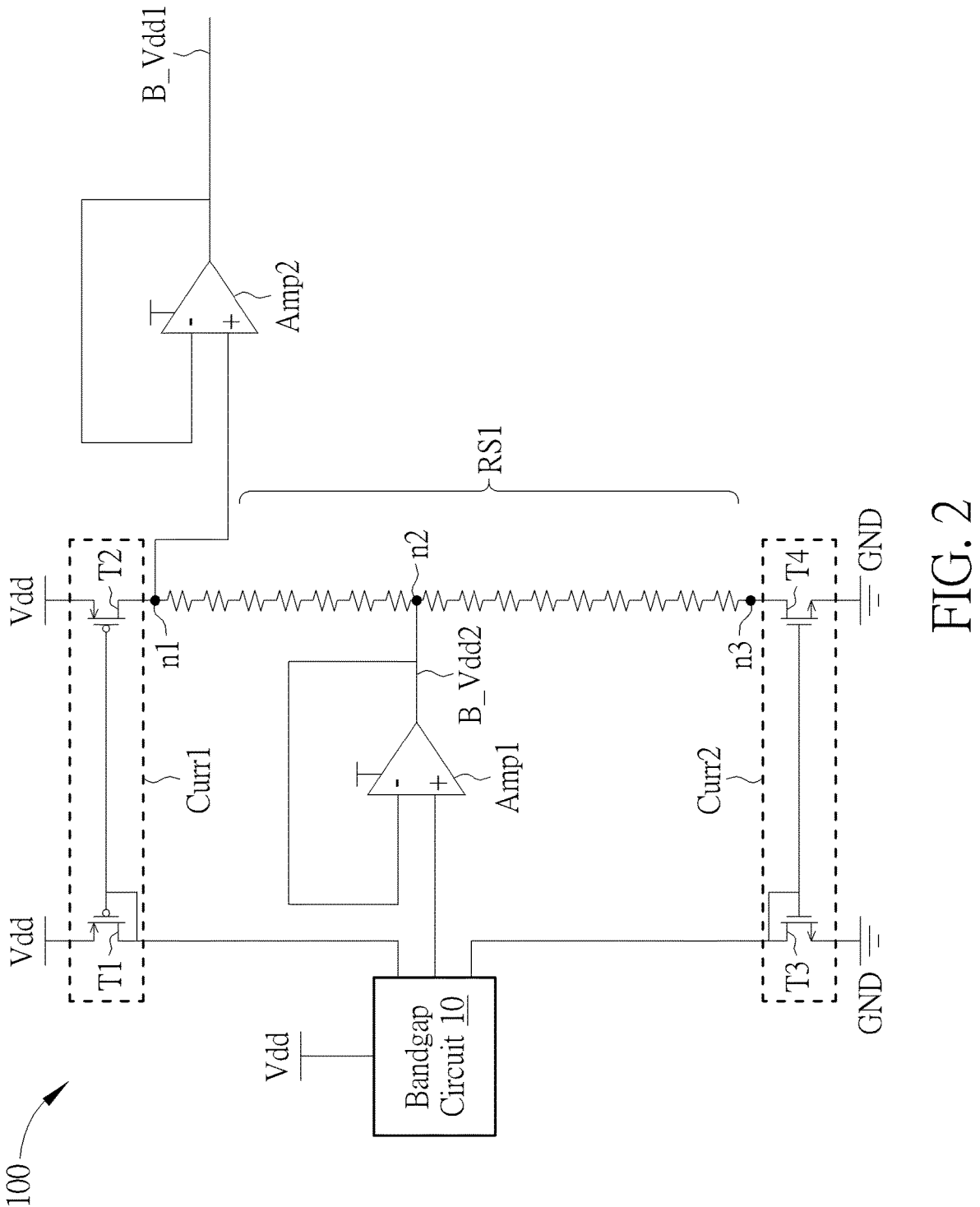
FIG. 2 is a circuit structure of a first current source and a second current source of the power ground noise reduction system in FIG. 1.

FIG. 2 is a circuit structure of the first current source Curr1 and the second current source Curr2 of the power ground noise reduction system 100. The first current source Curr1 and the second current source Curr2 can be two current mirror-based circuits. For example, the first current source Curr1 can include a first transistor T1 and a second transistor T2. The first transistor T1 includes a first terminal for receiving the working voltage Vdd, a second terminal coupled to the bandgap circuit 10 for receiving the bandgap reference voltage, and a control terminal coupled to the second terminal of the first transistor T1. The second transistor T2 includes a first terminal for receiving the working voltage Vdd, a second terminal coupled to the first node n1 of the first resistor string RS1, and a control terminal coupled to the control terminal of the first transistor T1. Here, the first transistor T1 and the second transistor T2 can be two P-type metal oxide semiconductor field effect transistors (P-MOSFETs). Since the first transistor T1 and the second transistor T2 can be formed as the current mirror, an output current of the second transistor T2 "only" depends on a reference input current of the first transistor T1. In other words, since the output current of the second transistor T2 is irreverent to a fluctuation of the working voltage Vdd, the power noise interference can be greatly reduced. Similarly, in FIG. 2, the second current source Curr2 includes a third transistor T3 and a fourth transistor T4. The third transistor includes a first terminal coupled to the bandgap circuit 10 for receiving the bandgap reference voltage, a second terminal coupled to the low voltage terminal GND, and a control terminal coupled to the first terminal of the third transistor T3. The fourth transistor T4 includes a first terminal coupled to the third node n3 of the first resistor string RS1, a second terminal coupled to the low voltage terminal GND, and a control terminal coupled to the control terminal of the third transistor T3. Here, the third transistor T3 and the fourth transistor T4 can be two N-type MOSFETs. Since the third transistor T3 and the fourth transistor T4 can be formed as a current mirror, an output current of the fourth transistor T4 "only" depends on a reference input current of the third transistor T3. In other words, since the output current of the fourth transistor T4 is irrelevant to a voltage fluctuation of the low voltage terminal GND, the ground noise interference can be greatly reduced.

Figure 3:
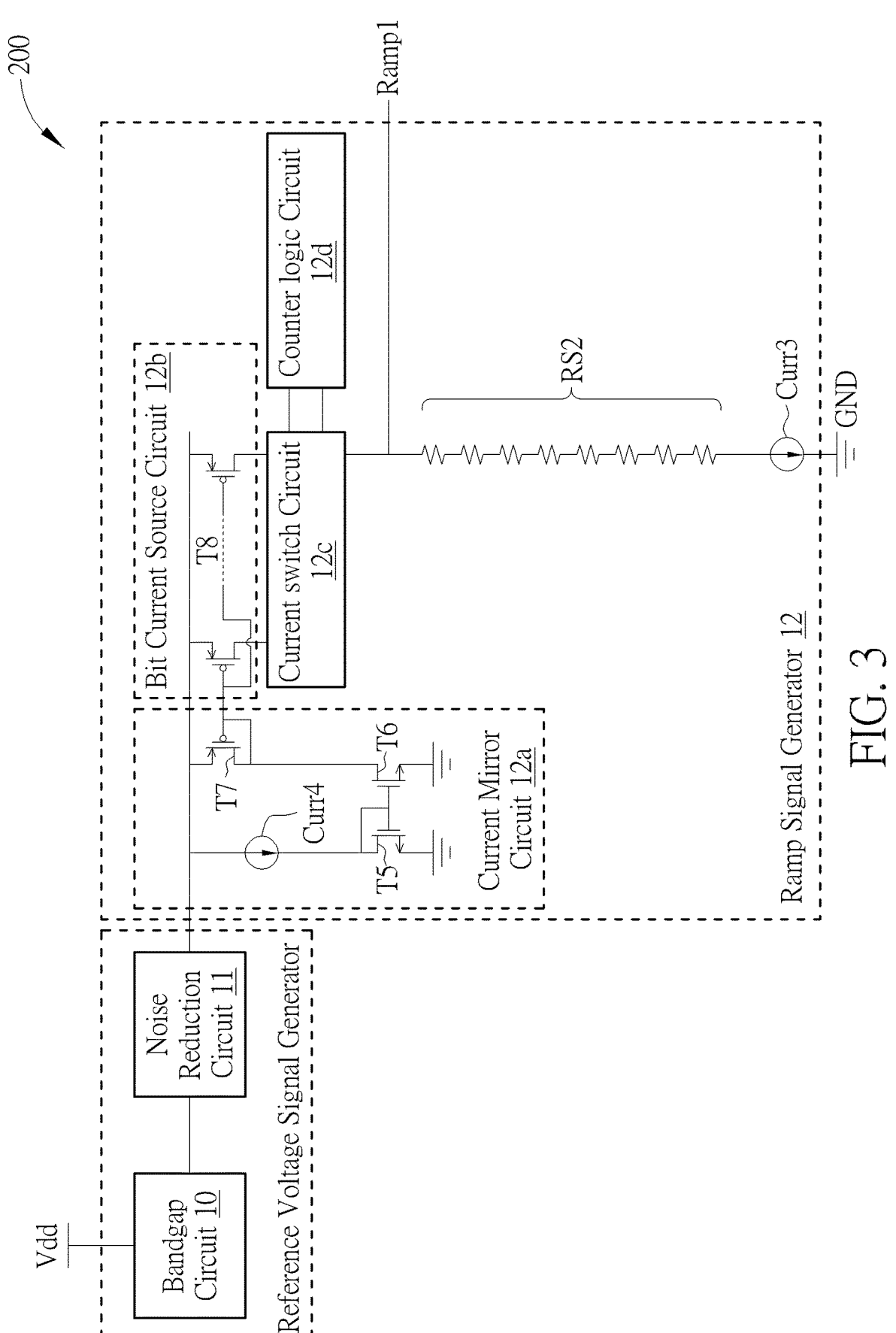
FIG. 3 is a block diagram of a power ground noise reduction system according to another embodiment of the present invention.

FIG. 3 is a block diagram of a power ground noise reduction system 200 according to another embodiment of the present invention. The power ground noise reduction system 100 can further introduce a ramp signal generator 12. To avoid ambiguity, the power ground noise reduction system 100 having the ramp signal generator 12 is called as the power ground noise reduction system 200 hereafter. In the power ground noise reduction system 200, the bandgap circuit 10 and the noise reduction circuit 11 can be formed as a reference voltage signal generator. The ramp signal generator 12 is coupled to the reference voltage signal generator, as illustrated below. The ramp signal generator 12 includes a first input terminal coupled to the output terminal of the noise reduction circuit 11, an output terminal for outputting a first ramp signal Ramp1, a ground terminal coupled to the low voltage terminal GND, and a third current source Curr3 is used for generating a third current to the low voltage terminal GND through the ground terminal. In the power ground noise reduction system 200, the first current of the first current source of the noise reduction circuit 11 is greater than the third current of the third current source Curr3. Circuit details of the ramp signal generator 12 are illustrated below.

The ramp signal generator 12 further includes a current mirror circuit 12a, a bit current source circuit 12b, a current switch circuit 12c, a counter logic circuit 12d, and a second resistor string RS2. The current mirror circuit 12a includes a fourth current source Curr4, a fifth transistor T5, a sixth transistor T6, and a seventh transistor T7. The fourth current source Curr4 includes an input terminal coupled to the output terminal of the noise reduction circuit 11, and an output terminal for outputting a fourth current. The fifth transistor T5 includes a first terminal coupled to the output terminal of the fourth current source Curr4, a second terminal coupled to the low voltage terminal GND, and a control terminal coupled to the first terminal of the fifth transistor T5. The sixth transistor T6 includes a first terminal, a second terminal coupled to the low voltage terminal GND, and a control terminal coupled to the control terminal of the fifth transistor T5. The seventh transistor T7 includes a first terminal coupled to the output terminal of the noise reduction circuit 11, a second terminal coupled to the first terminal of the sixth transistor T6, and a control terminal coupled to the second terminal of the seventh transistor T7. Here, the fifth transistor T5 and the sixth transistor T6 can be N-MOSFETs. The seventh transistor T7 can be a P-MOSFET. The bit current source circuit 12b includes a plurality of eighth transistors T8. Each of the eighth transistors T8 includes a first terminal coupled to the output terminal of the noise reduction circuit 11, a second terminal, a control terminal coupled to the control terminal of the seventh transistor T7. Here, the current mirror circuit 12a can control an operation state of the eighth transistors T8 (i.e., such as an enable state or a disable state). The current switch circuit 12c is coupled to second terminals of the plurality of eighth transistors T8 for outputting the first ramp signal Ramp1. The counter logic circuit 12d is coupled to the current switch circuit 12c for controlling the current switch circuit 12c. For example, when the eighth transistors T8 are enabled, the counter logic circuit 12d can control the current switch circuit 12c for accumulating currents or decreasing currents from the eighth transistors T8 overtime to generate the first ramp signal Ramp1. The second resistor string RS2 includes a first terminal coupled to the current switch circuit 12c, and a second terminal coupled to the third current source Curr3. Further, in the power ground noise reduction system 200, the third current source Curr3 can be implemented by various circuit structures, as illustrated below.

Figure 4:
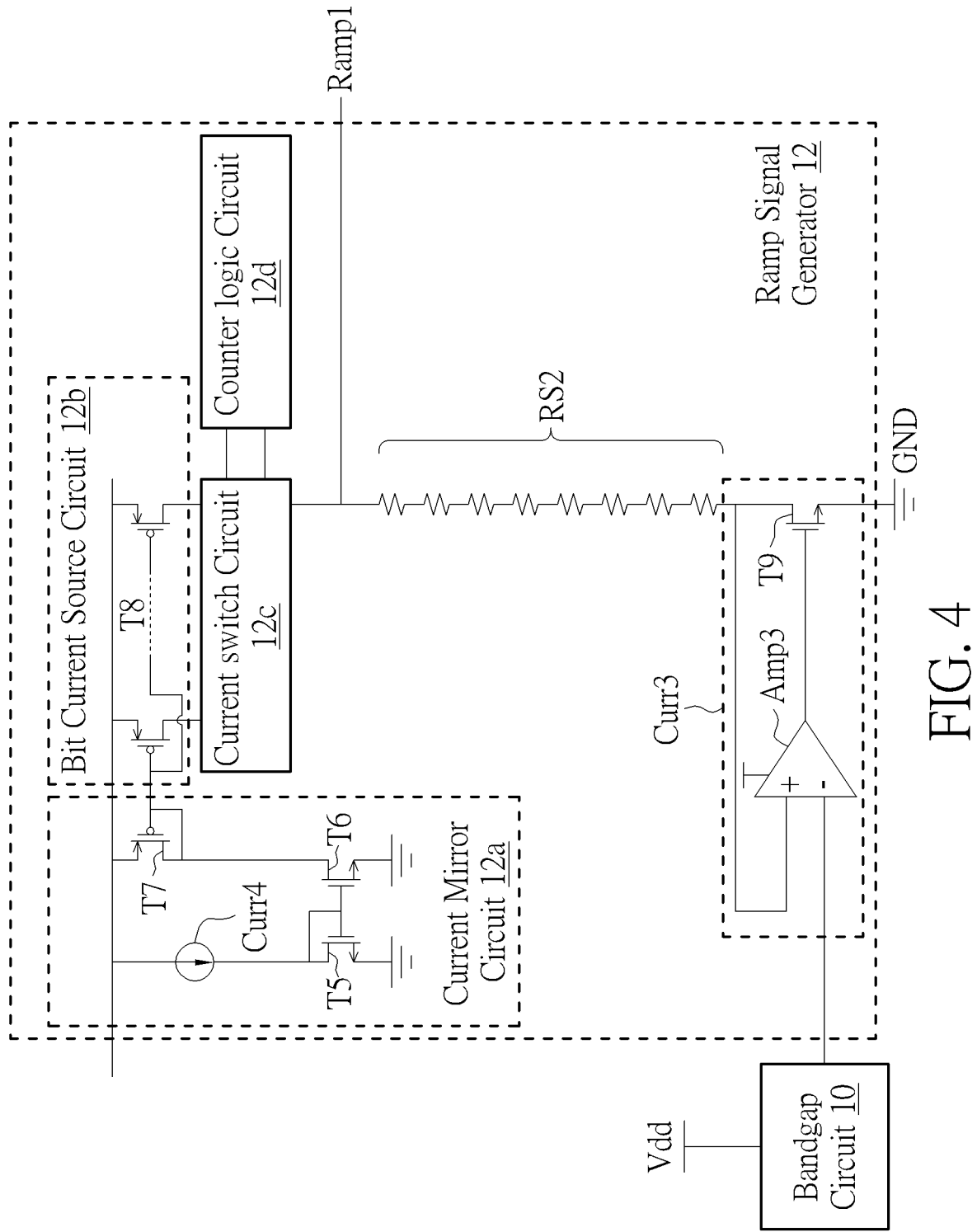
FIG. 4 is a first circuit structure of a third current source of a ramp signal generator of the power ground noise reduction system in FIG. 3.

FIG. 4 is a first circuit structure of the third current source Curr3 of the ramp signal generator 12 of the power ground noise reduction system 200. In FIG. 4, the third current source Curr3 includes a third amplifier Amp3 and a ninth transistor T9. The third amplifier Amp3 includes a first input terminal coupled to the second terminal of the second resistor string RS2 disposed inside the ramp signal generator 12, a second input terminal for receiving the bandgap reference voltage of the bandgap circuit 10, and an output terminal. The ninth transistor T9 includes a first terminal coupled to the first input terminal of the third amplifier Amp3, a second terminal coupled to the low voltage terminal GND, and a control terminal coupled to the output terminal of the third amplifier Amp3. As mentioned previously, the bandgap circuit 10 can be regarded as the reference voltage source having high stability for output the bandgap reference voltage. Since the bandgap reference voltage is stable, after the bandgap reference voltage is processed by the third amplifier Amp3, a cross voltage between the first terminal and the control terminal of the ninth transistor T9 is also stable. Therefore, no ground noise interference is introduced to the third current of the ninth transistor T9. The ground noise interference of the ramp signal generator 12 can be greatly reduced. Moreover, the ramp signal generator 12 can also be regarded as a power ground noise reduction system since the ramp signal generator 12 introduces a stable first buffered working voltage B_Vdd1 for reducing the power noise and the third current source Curr3 for reducing the ground noise.

Figure 5:
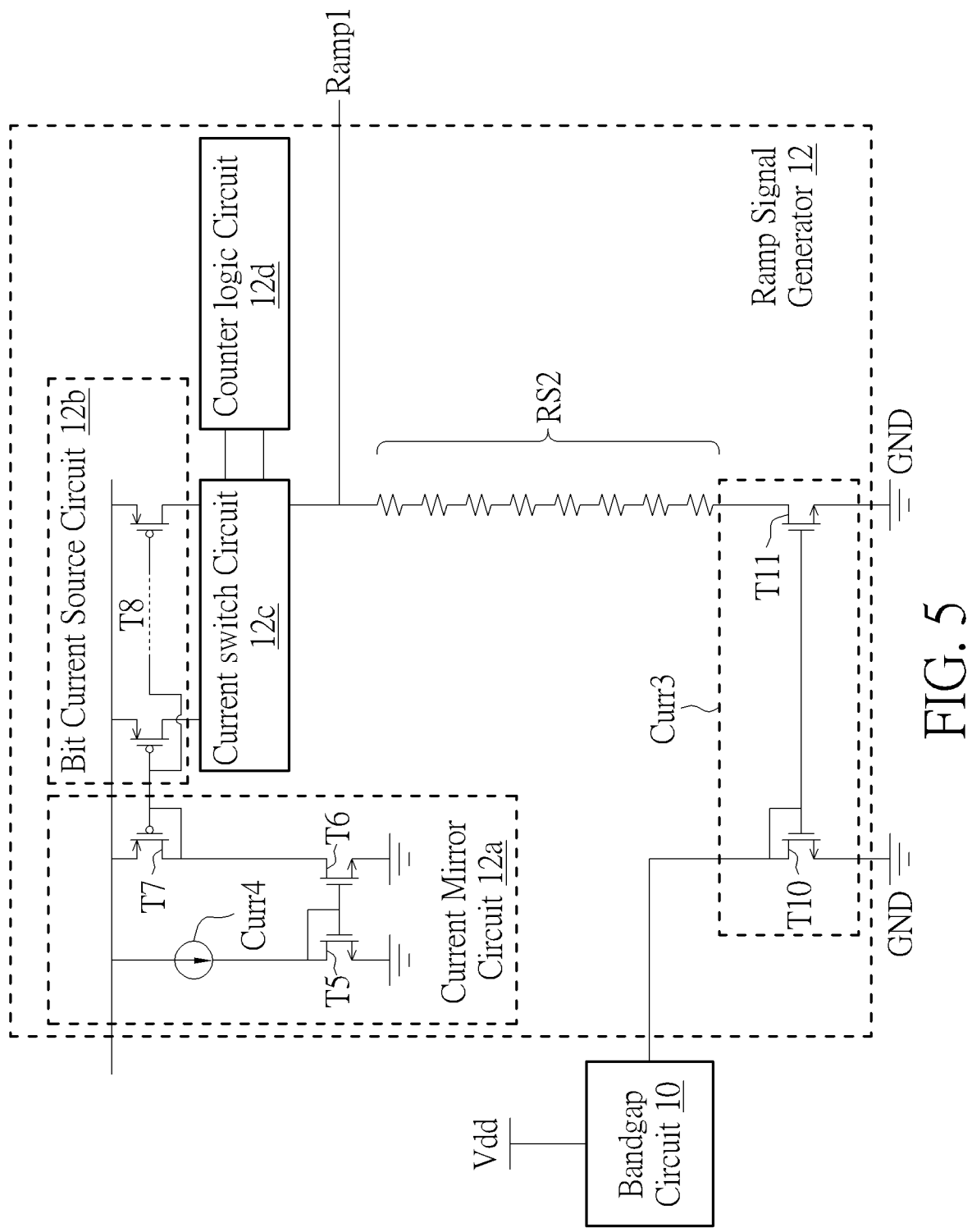
FIG. 5 is a second circuit structure of the third current source of the ramp signal generator of the power ground noise reduction system in FIG. 3.

FIG. 5 is a second circuit structure of the third current source Curr3 of the ramp signal generator 12 of the power ground noise reduction system 200. Similarly, the third current source Curr3 can be a current mirror-based circuit. For example, the third current source Curr3 can include a tenth transistor T10 and an eleventh transistor T1/. The tenth transistor T10 includes a first terminal for receiving the bandgap reference voltage of the bandgap circuit 10, a second terminal coupled to the low voltage terminal GND, and a control terminal coupled to the first terminal of the tenth transistor T10. The eleventh transistor T11 includes a first terminal coupled to the second terminal of the second resistor string RS2 disposed inside the ramp signal generator 12, a second terminal coupled to the low voltage terminal GND, and a control terminal coupled to the control terminal of the tenth transistor T10. Here, the tenth transistor T10 and the eleventh transistor T11 can be two N-type MOSFETs. Since the tenth transistor T10 and the eleventh transistor T11 can be formed as a current mirror, an output current of the eleventh transistor T11 "only" depends on a reference input current of the tenth transistor T10. In other words, since the output current of the eleventh transistor T11 is irrelevant to a voltage fluctuation of the low voltage terminal GND, the ground noise interference can be greatly reduced.

Figure 6:
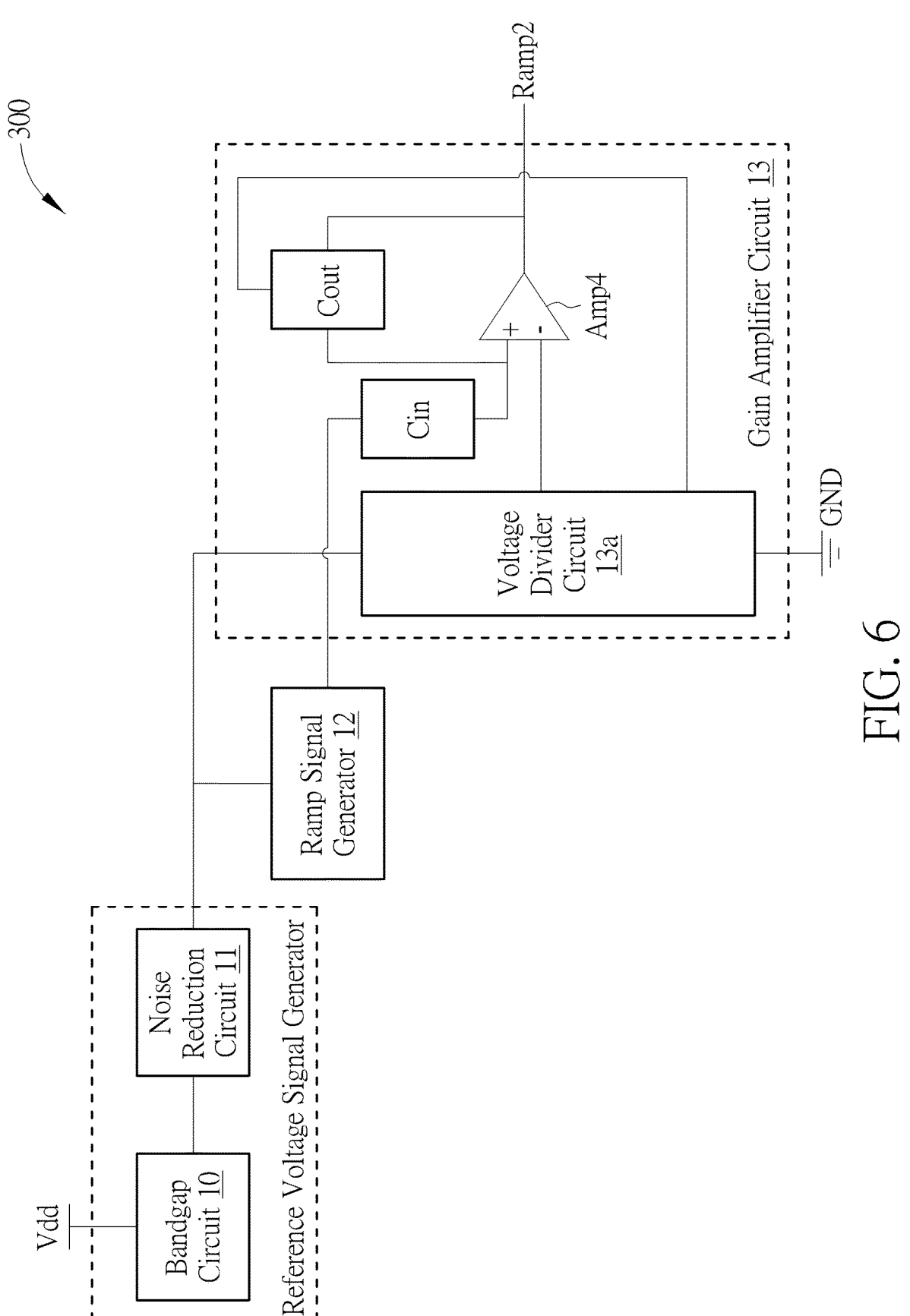
FIG. 6 is a block diagram of a power ground noise reduction system according to another embodiment of the present invention.

FIG. 6 is a block diagram of a power ground noise reduction system 300 according to another embodiment of the present invention. The power ground noise reduction system 200 can further introduce a gain amplifier circuit 13. To avoid ambiguity, the power ground noise reduction system 200 having the gain amplifier circuit 13 is called as the power ground noise reduction system 300 hereafter. In the power ground noise reduction system 300, the gain amplifier circuit 13 can include a voltage divider circuit 13a, a first switch capacitor circuit Cin, a fourth amplifier circuit Amp4, and a second switch capacitor Cout. The voltage divider circuit 13a can include an input terminal coupled to the output terminal of the noise reduction circuit 11, a first output terminal, a second output terminal, and a ground terminal coupled to the low voltage terminal GND. The first switch capacitor circuit Cin includes a first terminal for receiving the first ramp signal Ramp1 generated from the ramp signal generator 12, and a second terminal. The first switch capacitor circuit Cin can be formed by a plurality of controllable capacitors coupled in parallel. The fourth amplifier Amp4 includes a first input terminal coupled to the second terminal of the first switch capacitor circuit Cin, a second input terminal coupled to the first output terminal of the voltage divider circuit 13a, and an output terminal for outputting the second ramp signal Ramp2. The second switch capacitor circuit Cout includes a first terminal coupled to the first input terminal of the fourth amplifier Amp4, a second terminal coupled to the output terminal of the fourth amplifier Amp4, and a control terminal coupled to the second output terminal of the voltage divider circuit 13. Similarly, the second switch capacitor circuit Cout can be formed by a plurality of controllable capacitors coupled in parallel. Here, in the gain amplifier circuit 13, since the first impedance of the first switch capacitor circuit Cin and the second impedance of the second switch capacitor circuit Cout can be adjusted, a power gain of the first ramp signal Ramp1 outputted from the ramp signal generator 12 can be adjusted to generate the second ramp signal Ramp2. In other word, the power ground noise reduction system 300 can reduce the power ground noise and provide an adjustable ramp signal for various applications.

To sum up, the present invention discloses a power ground noise reduction system. The idea to reduce the power ground noise is to introduce a current source coupled to a high voltage terminal (i.e., such as a working voltage terminal) and a current source coupled to a low voltage terminal (i.e., such as a ground terminal). Since the current source can provide a stable current, the power noise interference and the ground noise interference can be reduced. Therefore the power ground noise reduction system of the present invention can be applied to various image sensor circuits or any application for providing high current stability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A power ground noise reduction system comprising:
   a bandgap circuit comprising:
      an input terminal configured to receive a working voltage; and
      an output terminal configured to output a bandgap reference voltage; and
   a noise reduction circuit comprising:
      a first input terminal coupled to the output terminal of the bandgap circuit and configured to receive the bandgap reference voltage;
      a second input terminal configured to receive the working voltage;
      an output terminal configured to output a first buffered working voltage;
      a ground terminal coupled to a low voltage terminal;
      a first current source configured to receive the working voltage received by the second input terminal and generate a first current;
      a second current source configured to generate a second current to the low voltage terminal through the ground terminal;
      a first amplifier comprising:
         a first input terminal;
         a second input terminal configured to receive the bandgap reference voltage; and
         an output terminal coupled to the first input terminal of the first amplifier and configured to output a second buffered working voltage;

a first resistor string comprising:

a first node coupled to the first current source;

a second node coupled to the output terminal of the first amplifier; and a third node coupled to the second current source; and a second amplifier comprising:

a first input terminal;

a second input terminal coupled to the first node of the first resistor string; and an output terminal coupled to the first input terminal of the second amplifier and configured to output the first buffered working voltage.

2. The power ground noise reduction system of claim 1, wherein the first current of the first current source is greater than the second current of the second current source.

3. The power ground noise reduction system of claim 1, wherein the first current source comprises:

a first transistor comprising:

a first terminal configured to receive the working voltage;

a second terminal coupled to the bandgap circuit; and a control terminal coupled to the second terminal of the first transistor; and a second transistor comprising:

a first terminal configured to receive the working voltage;

a second terminal coupled to the first node of the first resistor string; and a control terminal coupled to the control terminal of the first transistor.

4. The power ground noise reduction system of claim 1, wherein the second current source comprises:

a third transistor comprising:

a first terminal coupled to the bandgap circuit;

a second terminal coupled to the low voltage terminal; and a control terminal coupled to the first terminal of the third transistor; and a fourth transistor comprising:

a first terminal coupled to the third node of the first resistor string;

a second terminal coupled to the low voltage terminal; and a control terminal coupled to the control terminal of the third transistor.

5. The power ground noise reduction system of claim 1, further comprising:

a ramp signal generator comprising:

a first input terminal coupled to the output terminal of the noise reduction circuit;

an output terminal configured to output a first ramp signal;

a ground terminal coupled to the low voltage terminal; and a third current source configured to generate a third current to the low voltage terminal through the ground terminal.

6. The power ground noise reduction system of claim 5, wherein the first current of the first current source is greater than the third current of the third current source.

7. The power ground noise reduction system of claim 5, wherein the third current source comprises:

a third amplifier comprising:

a first input terminal coupled to the second terminal of a second resistor string disposed inside the ramp signal generator;

a second input terminal configured to receive the bandgap reference voltage; and an output terminal; and a ninth transistor comprising:

a first terminal coupled to the first input terminal of the third amplifier;

a second terminal coupled to the low voltage terminal; and a control terminal coupled to the output terminal of the third amplifier.

8. The power ground noise reduction system of claim 5, wherein the third current source comprises:

a tenth transistor comprising:

a first terminal configured to receive the bandgap reference voltage;

a second terminal coupled to the low voltage terminal; and a control terminal coupled to the first terminal of the tenth transistor; and an eleventh transistor comprising:

a first terminal coupled to the second terminal of a second resistor string disposed inside the ramp signal generator;

a second terminal coupled to the low voltage terminal; and a control terminal coupled to the control terminal of the tenth transistor.

9. The power ground noise reduction system of claim 5, further comprising:

a gain amplifier circuit comprising:

a first input terminal coupled to the output terminal of the noise reduction circuit and configured to receive the first buffered working voltage;

a second input terminal coupled to the output terminal of the ramp signal generator and configured to receive the first ramp signal;

a ground terminal coupled to the low voltage terminal; and an output terminal configured to output a second ramp signal;

wherein a power gain of the first ramp signal is adjusted to generate the second ramp signal.

10. A power ground noise reduction system comprising:

a ramp signal generator comprising:

a current mirror circuit configured to receive a first buffered working voltage;

a bit current source circuit coupled to the current mirror circuit;

a current switch circuit coupled to the bit current source circuit and configured to output a first ramp signal;

a counter logic circuit coupled to the current switch circuit and configured to control the current switch circuit;

a second resistor string comprising:

a first terminal coupled to the current switch circuit; and a second terminal; and a third current source coupled to the second terminal of the second resistor string and configured to generate a third current to a low voltage terminal.

11. The power ground noise reduction system of claim 10, wherein the current mirror circuit comprises:

a fourth current source comprising:

an input terminal configured to receive the first buffered working voltage; and an output terminal configured to output a fourth current;

9 a fifth transistor comprising:
    a first terminal coupled to the output terminal of the fourth current source;
    a second terminal coupled to the low voltage terminal; and
    a control terminal coupled to the first terminal of the fifth transistor;
a sixth transistor comprising:
    a first terminal;
    a second terminal coupled to the low voltage terminal; and
    a control terminal coupled to the control terminal of the fifth transistor; and
a seventh transistor comprising:
    a first terminal configured to receive the first buffered working voltage;
    a second terminal coupled to the first terminal of the sixth transistor; and
    a control terminal coupled to the second terminal of the seventh transistor.

12. The power ground noise reduction system of claim 11, wherein the bit current source circuit comprises:
    a plurality of eighth transistors, each of the eighth transistors comprising:
        a first terminal configured to receive the first buffered working voltage;
        a second terminal coupled to the current switch circuit; and
        a control terminal coupled to the control terminal of the seventh transistor.

13. The power ground noise reduction system of claim 10, wherein the third current source comprises:
    a third amplifier comprising:
        a first input terminal coupled to the second terminal of the second resistor string;
        a second input terminal configured to receive a bandgap reference voltage; and
        an output terminal; and
    a ninth transistor comprising:
        a first terminal coupled to the first input terminal of the third amplifier;
        a second terminal coupled to the low voltage terminal; and
        a control terminal coupled to the output terminal of the third amplifier.

14. The power ground noise reduction system of claim 10, wherein the third current source comprises:
    a tenth transistor comprising:
        a first terminal configured to receive a bandgap reference voltage;
        a second terminal coupled to the low voltage terminal; and
        a control terminal coupled to the first terminal of the tenth transistor; and
    an eleventh transistor comprising:
        a first terminal coupled to the second terminal of the second resistor string;
        a second terminal coupled to the low voltage terminal; and
        a control terminal coupled to the control terminal of the tenth transistor.

15. The power ground noise reduction system of claim 10, further comprising:
    a bandgap circuit comprising:
        an input terminal configured to receive a working voltage; and

10 an output terminal configured to output a bandgap reference voltage; and
    a noise reduction circuit comprising:
        a first input terminal coupled to the output terminal of the bandgap circuit and configured to receive the bandgap reference voltage;
        a second input terminal configured to receive the working voltage;
        an output terminal coupled to the current mirror circuit;
        a ground terminal coupled to the low voltage terminal;
        a first current source configured to receive the working voltage received by the second input terminal and generate a first current; and
        a second current source configured to generate a second current to the low voltage terminal through the ground terminal;
        wherein the first current is greater than the second current.

16. The power ground noise reduction system of claim 15, wherein the noise reduction circuit further comprises:
    a first amplifier comprising:
        a first input terminal;
        a second input terminal configured to receive the bandgap reference voltage; and
        an output terminal coupled to the input terminal of the first amplifier and configured to output a second buffered working voltage;
    a first resistor string comprising:
        a first node coupled to the first current source;
        a second node coupled to the output terminal of the first amplifier; and
        a third node coupled to the second current source; and
    a second amplifier comprising:
        a first input terminal;
        a second input terminal coupled to the first node of the first resistor string;
        an output terminal coupled to the first input terminal of the second amplifier and configured to output the first buffered working voltage.

17. The power ground noise reduction system of claim 16, wherein the first current source comprises:
    a first transistor comprising:
        a first terminal configured to receive the working voltage;
        a second terminal coupled to the bandgap circuit; and
        a control terminal coupled to the second terminal of the first transistor; and
    a second transistor comprising:
        a first terminal configured to receive the working voltage;
        a second terminal coupled to the first node of the first resistor string; and
        a control terminal coupled to the control terminal of the first transistor.

18. The power ground noise reduction system of claim 16, wherein the second current source comprises:
    a third transistor comprising:
        a first terminal coupled to the bandgap circuit;
        a second terminal coupled to the low voltage terminal; and
        a control terminal coupled to the first terminal of the third transistor; and
    a fourth transistor comprising:
        a first terminal coupled to the third node of the first resistor string;
        a second terminal coupled to the low voltage terminal; and a control terminal coupled to the control terminal of the third transistor.

19. The power ground noise reduction system of claim 15, further comprising:

a gain amplifier circuit comprising:

a first input terminal coupled to the output terminal of the noise reduction circuit and configured to receive the first buffered working voltage;

a second input terminal configured to receive the first ramp signal;

a ground terminal coupled to the low voltage terminal; and an output terminal configured to output a second ramp signal;

wherein a power gain of the first ramp signal is adjusted to generate the second ramp signal.

* * * * *